(12) United States Patent
van der Burg (10) Patent No.: US 10,477,747 B2
(45) Date of Patent: Nov. 12, 2019

(54) COMPONENT PLACEMENT DEVICE AND METHOD OF DRIVING THE SAME

(71) Applicant: ASSEMBLÉON B.V., Eindhoven (NL)

(72) Inventor: Richard Adrianus Johannes van der Burg, Eindhoven (NL)

(73) Assignee: Assembléon B.V., Eindhoven (NL)

( * ) Notice: Subject to any disclaimer, the term of this patent is extended or adjusted under 35 U.S.C. 154(b) by 61 days.

(21) Appl. No.: 15/717,268

(22) Filed: Sep. 27, 2017

(65) Prior Publication Data

US 2018/0092262 A1    Mar. 29, 2018

Related U.S. Application Data

(60) Provisional application No. 62/401,550, filed on Sep. 29, 2016.

(51) Int. Cl.
| | |
|---|---|
| *H05K 13/04* | (2006.01) |
| *B23P 19/02* | (2006.01) |
| *B23Q 1/70* | (2006.01) |
| *B65G 47/90* | (2006.01) |

(52) U.S. Cl.
CPC .......... *H05K 13/0404* (2013.01); *B23P 19/02* (2013.01); *B23Q 1/706* (2013.01); *B65G 47/90* (2013.01); *H05K 13/0406* (2018.08); *H05K 13/0452* (2013.01)

(58) Field of Classification Search
None
See application file for complete search history.

(56) References Cited

U.S. PATENT DOCUMENTS

| | | | | |
|---|---|---|---|---|
| 6,012,346 | A | * | 1/2000 | Vo .......................... B23D 51/16 30/392 |
| 6,048,750 | A | * | 4/2000 | Hembree .............. H01L 21/681 438/107 |
| 9,193,015 | B2 | | 11/2015 | van de Rijdt |
| 2005/0236908 | A1 | | 10/2005 | Rivin |
| 2009/0217514 | A1 | * | 9/2009 | Kimura .............. H05K 13/0411 29/739 |

FOREIGN PATENT DOCUMENTS

| | | |
|---|---|---|
| EP | 1937050 | 6/2008 |
| WO | WO2015/145613 A1 | 10/2005 |

OTHER PUBLICATIONS

International Search Report dated Jan. 24, 2018, International Application No. PCT/IB2017/001335.

* cited by examiner

*Primary Examiner* — Ronald P Jarrett
(74) *Attorney, Agent, or Firm* — Christopher M. Spietzer, Sr.

(57) ABSTRACT

A component placement device is provided. The component placement device includes a machine frame, a subframe supported by the machine frame, and a component pickup unit. The component pickup unit is movable relative to the subframe. The component pickup unit is movable by a first drive at least in a direction of movement. The component placement device includes a movable counter-mass being movable relative to the subframe by a second drive in a direction opposite to the direction of movement of the component pickup unit to at least partially counteract a reactive force exerted on the subframe by the component pickup unit during movement of the component pickup unit in the direction of movement relative to the subframe.

13 Claims, 8 Drawing Sheets

COMPONENT PLACEMENT DEVICE AND METHOD OF DRIVING THE SAME

CROSS-REFERENCE TO RELATED APPLICATION

This application claims the benefit of U.S. Provisional Patent Application No. 62/401,550, filed Sep. 29, 2016, the contents of which are incorporated herein by reference.

FIELD

The invention relates to component placement devices which are being used to pick up components from pickup positions and place the components on desired positions on a substrate.

BACKGROUND

U.S. Pat. No. 9,193,015 B2 discloses an exemplary component placement device. The placement of such components desirably occurs with high speed and accuracy.

To attain such a high speed, the component pickup unit is moved from the pickup position with a relatively high acceleration. In a similar manner, the component pickup unit is quickly decelerated near the desired position on the substrate or, in other words, is moved with a relatively high negative acceleration. Such high accelerations also occur upon returning to the pickup position. Because of such accelerations, relatively large reactive forces are exerted on the subframe by the component pickup unit. Such reactive forces cause among other things, vibrations and deformations of the machine frame and possible other subframes supported by the machine frame, thus affecting the accuracy with which another component pickup unit can be moved to a desired position. This effect is called dynamic crosstalk, which term is understood to mean the influence of the dynamic behaviour of one component pickup unit on the positioning accuracy of another component pickup unit. Vibrations and deformations of the machine frame may affect other devices in the neighbourhood of the component placement device.

In order to reduce the influence of such reactive forces, it is possible to move the component pickup unit at lower accelerations. However, this will have an adverse effect on the number of components that can be moved per unit time. Another possibility is to make the machine frame much heavier and stiffer, so that the reactive forces can be better absorbed. This will make the component placement device relatively costly to produce and use, however.

According to U.S. Pat. No. 9,193,015 B2, the component placement device includes a machine frame and component pickup units which are movable relative to a respective subframe supported by the machine frame. The component pickup units are movable in a direction of movement. The component placement device includes means for determining the magnitude of a counterforce to be exerted on the subframe substantially in the direction of movement, as well as at least one drive unit for exerting the counterforce determined by the means substantially in the direction of movement on the subframe for the purpose of at least partially counteracting a reactive force exerted on the subframe by the component pickup unit during movement of the component pickup unit in the direction of movement relative to the subframe.

The drive unit of U.S. Pat. No. 9,193,015 B2 includes two parts, whereby the subframe is provided with a first part of the drive unit, while a second part of the drive unit, which cooperates with the first part of the drive unit, is mounted on an auxiliary frame that is freestanding from the machine frame. A disadvantage of the component placement unit according to U.S. Pat. No. 9,193,015 B2 is that it utilizes such an auxiliary freestanding frame.

The size and costs of the auxiliary freestanding frame depends on the number of component pick up units. The costs for such a frame for a single component pick up unit are relatively high. If one common frame is made for all component pick up units, the costs per component pick up are lower but only if each component pick up unit includes such a drive unit. The flexibility of the known component placement unit is thereof low.

SUMMARY

Exemplary embodiments of the invention relate to a component placement device including at least a machine frame and a component pickup unit which is movable relative to a subframe supported by the machine frame, the component pickup unit being movable by a first drive at least in a direction of movement. The invention also relates to a method for driving such a component placement device.

An object of the invention is to provide a component placement device and a method for driving such a component placement device, wherein reactive forces exerted by the component placement unit will have no or practically no effect on the machine frame.

In accordance with certain exemplary embodiments of the invention, this object is accomplished with the component placement unit in that the component placement device includes a movable counter-mass being movable relative to the subframe by a second drive in a direction opposite to the direction of movement of the component pickup unit to at least partially counteract a reactive force exerted on the subframe by the component pickup unit during movement of the component pickup unit in the direction of movement relative to the subframe.

The movable counter-mass is being moved in an opposite direction as compared to the component pickup unit and with such an acceleration or deceleration that the counter-mass causes a counterforce which at least partially (and preferably completely) counteracts the reactive force exerted on the subframe by the component pickup unit. Since the weight of the component to be picked up by the component pickup unit is relatively small compared to the weight of the component pickup unit, the differences in the weight of different components to be placed by the component pickup unit will have little or no influence on the desired weight of the counter-mass.

Since the counter-mass and the component pickup unit are independently and individually movable with respect to the subframe, control of the movement of the counter-mass and the component pickup unit is relatively easy.

Another advantage of the use of a counter-mass is that in case the component placement device includes a number of component pickup units, each component pickup unit can be individually provided with a counter-mass and its respective second drive, if desired or necessary.

One embodiment of the component placement device according to the invention is characterized in that forces exerted by the second drive for driving the counter-mass are in line with the forces exerted by the first drive for driving the component pickup unit during movement of the countermass and the component pickup unit. Since the forces are in line, no torque forces (or substantially no torque forces) are introduced on the sub-frame.

One embodiment of the component placement device according to the invention is characterized in that a virtual line through the center of mass of the component pickup unit and the center of mass of the counter-mass extends parallel to the direction of movement during movement of the component pickup unit and the counter-mass. Since the component pickup unit and the counter-mass are being moved in opposite directions along the same line, no torque forces (or substantially no torque forces) are introduced on the sub-frame.

Yet another embodiment of the component placement device according to the invention is characterized in that the component placement device includes a control unit for delivering a control signal (e.g., a current command) for controlling the movement of the component pickup unit in the direction of movement, wherein the control unit is provided with means to use the actual position of the component pickup unit as a setpoint for calculating the desired position of the counter-mass.

The control unit may function as a master-slave unit, whereby the control of the movement of the component pickup unit is the master control, whereas the control of the movement of the counter-mass is a slave control following the movement of the component pickup unit.

Yet another embodiment of the component placement device according to the invention is characterized in that a current command provided by the control unit to the first drive of the component placement unit is also provided to the second drive of the counter-mass.

By feeding forward the current command the synchronization accuracy of the master-slave control is improved.

Yet another embodiment of the component placement device according to the invention is characterized in that the first and second drives for the component placement unit and the counter-mass includes linear motors, each linear motor being provided with a linear stator supported by the sub-frame and permanent magnets being located on the component placement unit and the counter-mass respectively. With such linear motors, the control of the movement of the component placement unit and the counter-mass respectively is relatively easy.

Yet another embodiment of the component placement device according to the invention is characterized in that the component placement device includes at least two component pickup units which are each independently movable at least in a direction of movement relative to a corresponding subframe supported by the machine frame, whereby each component pickup unit cooperates with a respective counter-mass being movable in a direction opposite to the direction of movement of the corresponding component pickup unit.

By having two or more component pickup units, each cooperating with a corresponding counter-mass, dynamic crosstalk (which term is understood to mean the influence of the dynamic behaviour of one component pickup unit on the positioning accuracy of another component pickup unit) is avoided or limited.

The invention also relates to a method for driving a component placement device including at least a machine frame and a component pickup unit which is movable relative to a subframe supported by the machine frame, the component pickup unit being movable at least in a direction of movement by a first drive, wherein the component placement device includes a movable counter-mass being movable relative to the subframe by a second drive in a direction opposite to the direction of movement of the component pickup unit to at least partially counteract a reactive force exerted on the subframe by the component pickup unit while moving the component pickup unit in the direction of movement relative to the subframe.

The movable counter-mass is being moved in an opposite direction as compared to the component pickup unit and with such an acceleration or deceleration that the counter-mass causes a counterforce which at least partially (and preferably completely) counteracts the reactive force exerted on the subframe by the component pickup unit.

One embodiment of the method according to the invention is characterized in that the component placement device includes a control unit which delivers a control signal (e.g., a current command) for controlling the movement of the component pickup unit in the direction of movement, wherein the actual position of the component pickup unit is used as a setpoint for calculating the position of the counter-mass by the drive unit.

The control unit works as a master-slave unit, whereby the control of the movement of the component pickup unit is the master control, and the control of the movement of the counter-mass is a slave control following the movement of the component pickup unit.

Another embodiment of the method according to the invention is characterized in that a current command provided by the control unit to a drive of the component placement device is also provided to a drive of the counter-mass.

By feeding forward the current command the synchronization accuracy of the master-slave control is improved.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Figure 1:
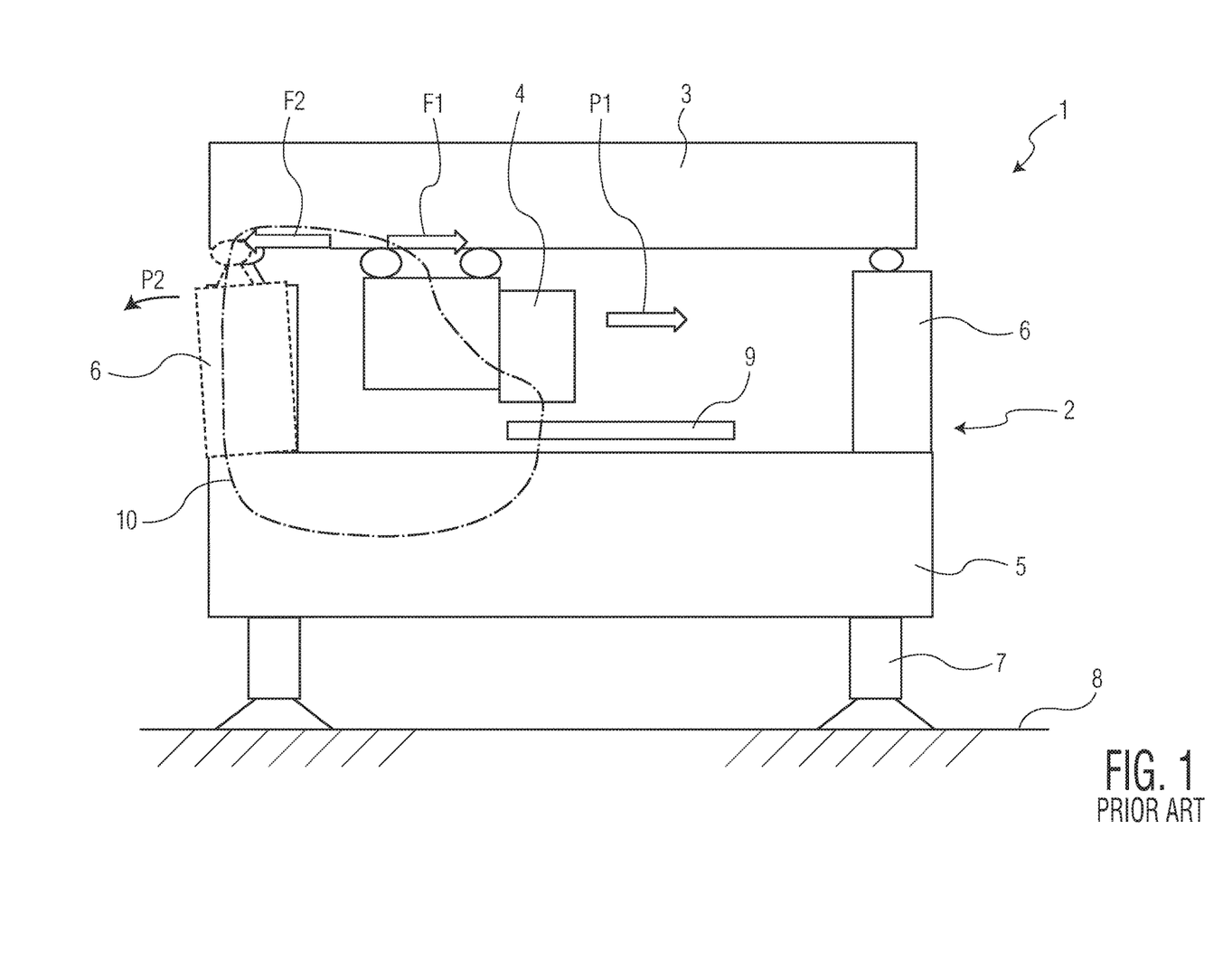
FIG. 1 is a schematic side view of a component placement device according to the prior art.

FIG. 1 shows a schematic side view of a component placement device 1 according to the prior art, which includes a machine frame 2, a subframe 3 supported by the machine frame 2 and a component pickup unit 4 which is movable relative to the subframe 3. The component pickup unit 4 is movable at least in a direction of movement indicated by arrow P1 and in the opposite direction. The machine frame 2 includes a support part 5 and upright parts 6 disposed on either side of the support part 5. The support part 5 is supported on a base 8 via support legs 7. Supported on the support part 5, between the upright parts 6, is a conveying device (not shown) for conveying substrates 9 in a direction transversely to the plane of the drawing. The component pickup unit 4 is movable in a usual manner, as for example known from EP 1 937 050 A1, from a component pickup position (not shown) to a desired position above the substrate 9 for picking up, moving and subsequently positioning the picked-up component on the substrate 9. The movement of the component pickup unit 4 relative to the subframe 3 takes place by means of a motor which is controlled by a control unit for moving the component pickup unit 4 with the desired accelerations and at the desired speeds. Upon acceleration of the component pickup unit 4 in the direction indicated by arrow P1, the motor exerts a force F1 in the direction indicated by arrow P1 on the component pickup unit 4. This results in a reactive force F2 of the component pickup unit 4 on the subframe 3, which reactive force F2 is equal in magnitude to the force F1 but opposite in direction thereto. The reactive force F2 is exerted on the upright part 6 via the subframe 3, as a result of which the upright part 6 will bend elastically in the direction indicated by arrow P2. The bent shape is illustrated in dotted lines. The degree of bending is shown on an enlarged scale for the sake of clarity. The deformation of the part 6 causes the subframe 3 to move in the opposite direction of arrow P1. The varying reactive forces F2 will cause vibrations. Once the reactive force F2 decreases, the part 6 will bend back. Because the reactive force F2 will decrease to zero when the component pickup unit 4 is stopped for picking up or placing a component, the vibrations will dampen out and the vibrations and movements in the machine frame caused by the reactive force F2 will have practically no effect on the accuracy during placement of the component by means of the stationary component pickup unit 4.

If, however, a second subframe 3 is present on the machine frame 2 next to the first subframe 3, which second subframe 3 is also provided with a second component pickup unit 4 that is movable relative to the second subframe 3, the deformations and vibrations in the machine frame 2 caused by the reactive force F2 will interfere with an accurate placement of a component by means of said second component pickup unit 4, since the deformations and vibrations affect, via the loop 10 (illustrated in dotted lines), the relative positions of the parts present in the loop 10. As a result, accurate placement of a component by means of the component pickup unit 4 of the second subframe with a degree of accuracy of less than 15 microns or less is typically not possible. It also stands to reason that the reactive forces that occur during movement of the component pickup unit 4 over the second subframe will have a negative effect on the placement accuracy of the component pickup unit 4 of the first subframe. Furthermore, the deformations and vibrations in the machine frame 2 caused by the reactive force F2 might cause vibrations in other equipment in the vicinity of the component placement device 1.

Figure 2:
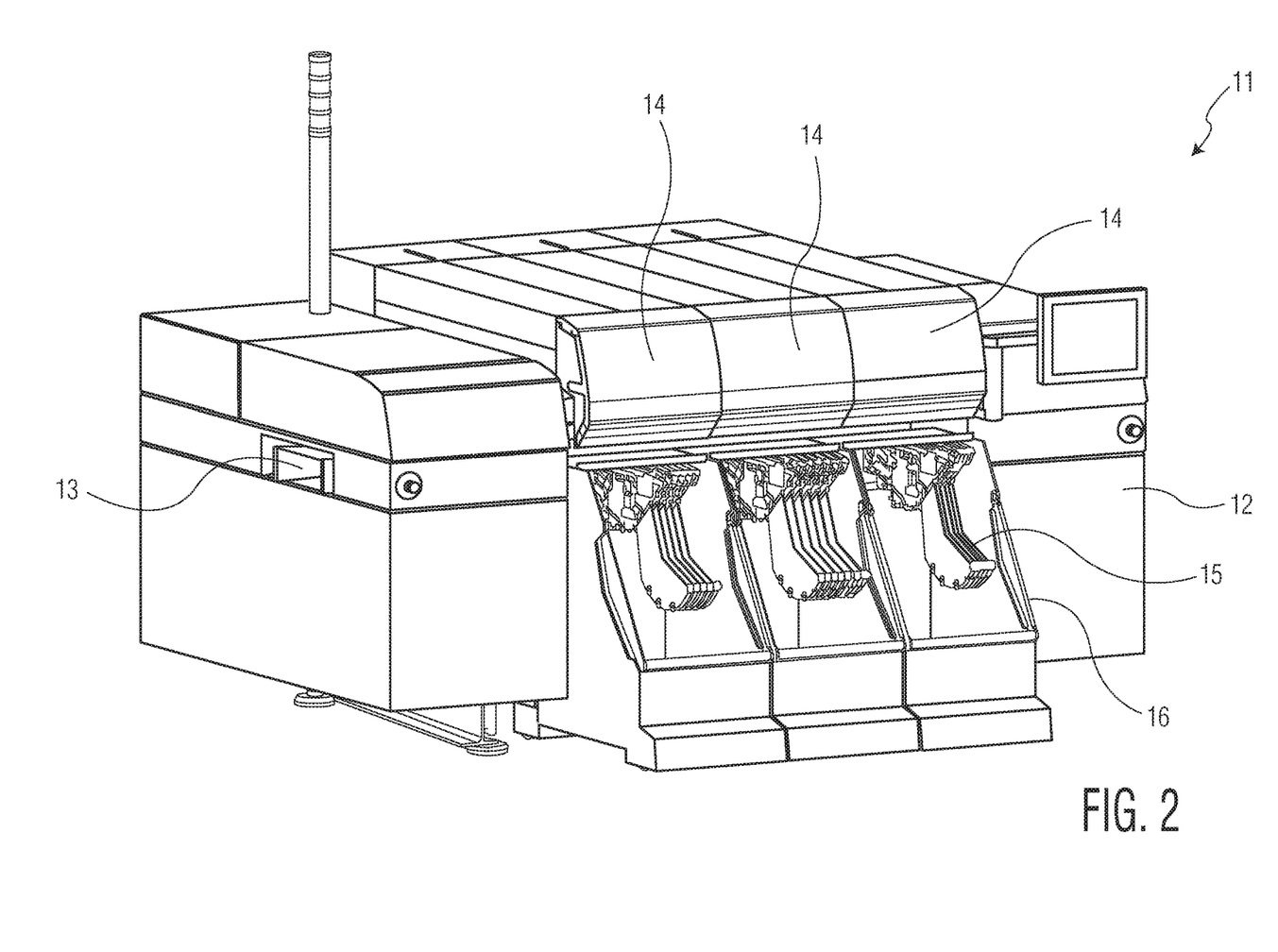
FIG. 2 is a perspective front view of an embodiment of a component placement device according to an exemplary embodiment of the invention.

FIG. 2 shows a perspective front view of an embodiment of a component placement device 11 according to the invention, which includes a machine frame 12, a conveying device 13 for substrates, which is supported by the machine frame 12, and three subframes 14. The component placement device 11 includes, at a front side thereof, a number of component supplying devices 15, which are accommodated in exchangeable holders 16.

Figure 3:
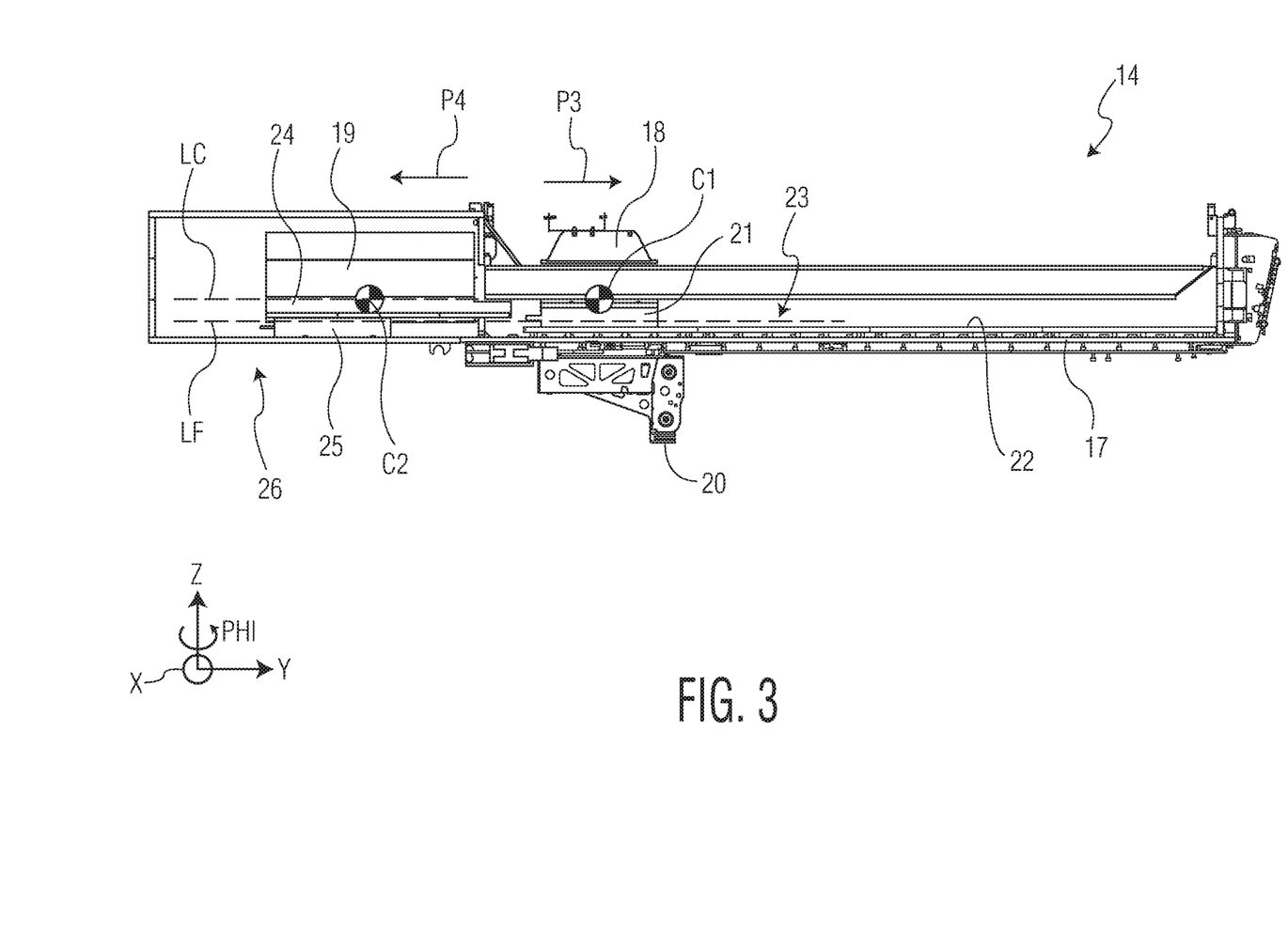
FIG. 3 is a cross section of a subframe of the component placement device according to the invention as shown in FIG. 2, with the component placement unit and counter-mass located close to each other.
Figure 4:
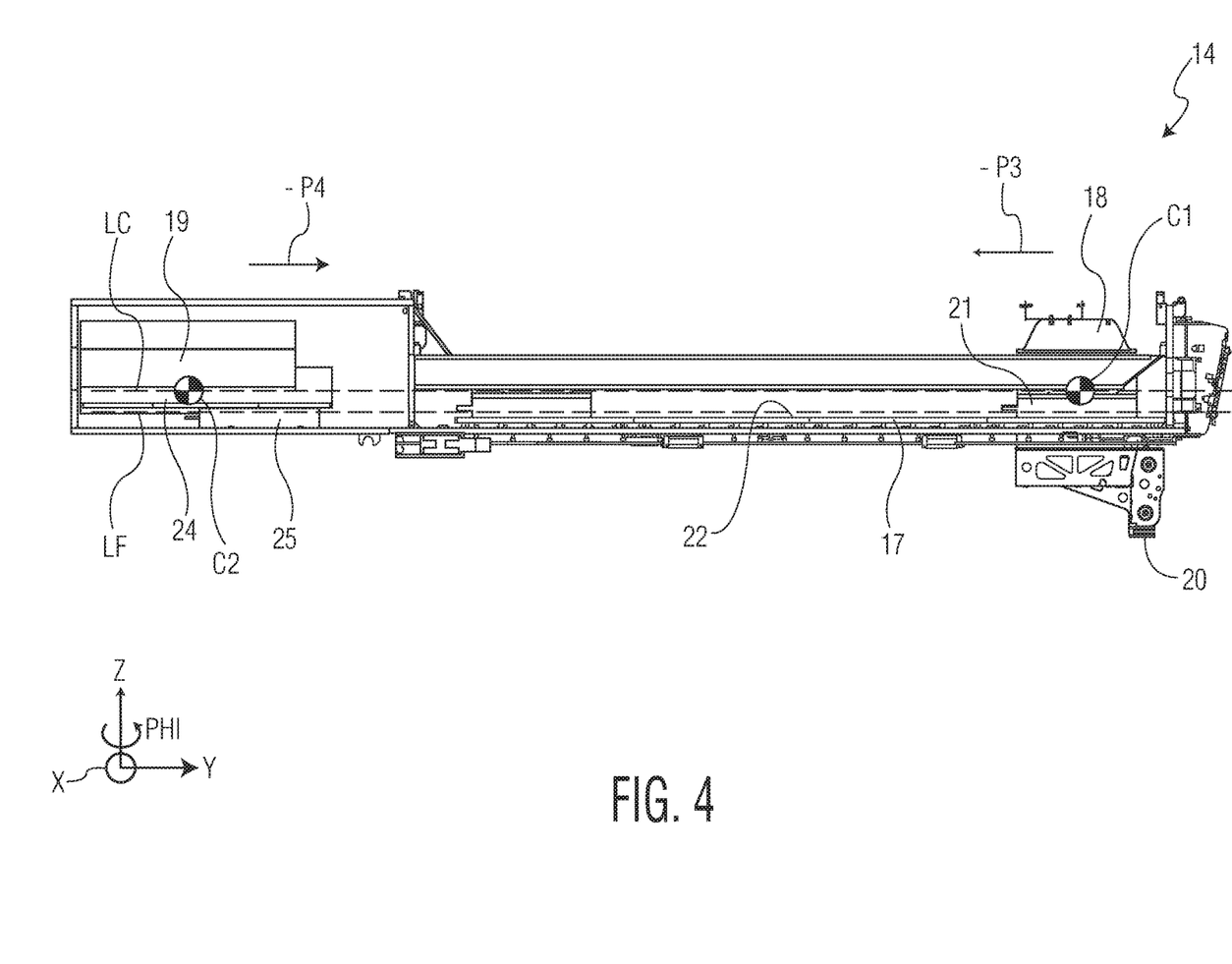
FIG. 4 is a cross section of a subframe of the component placement device according to the invention as shown in FIG. 2, with the component placement unit and counter-mass located spaced apart.

FIGS. 3 and 4 show cross sections of a subframe 14 of the component placement device 11. The subframe 14 includes an elongate profile 17 which supports a component pickup unit 18 (sometimes referred to herein as a component placement unit 18/18', see FIGS. 5A-5B) and a counter-mass 19 (sometimes referred to herein as a counter mass unit 19/19', see FIGS. 5A-5B). The component pickup unit 18 is provided at its lower side 20 with a nozzle (not shown), by means of which a component can be picked up. The component pickup unit 18 is provided with permanent magnets 21 being located opposite a linear stator 22. The permanent magnets 21 and the linear stator 22 form a first drive 23. The component pickup unit 18 is movable in, and opposite to, a direction indicated by arrow P3 by means of the first drive 23.

The counter-mass 19 is provided with permanent magnets 24 being located opposite a linear stator 25. The permanent magnets 24 and the linear stator 25 form a second drive 26. By means of the second drive 26 the counter-mass 19 is movable in and opposite to a direction indicated by arrow P4. The arrows P3 and P4 extend in opposite directions to clearly indicate that the component pickup unit 18 and a counter-mass 19 will always be moved in opposite directions.

Forces exerted by the second drive 26 for driving the counter-mass 19 are in line with the forces exerted by the first drive 23 for driving the component pickup unit 18 during movement of the counter-mass 19 and the component pickup unit 18 in, or opposite to, the directions as indicated by arrows P4, P3. The forces extend along virtual line LF.

A virtual line LC through the center of mass C1 of the component pickup unit 18 and the center of mass C2 of the counter-mass 19 extends parallel to the direction of movement P3, P4 during movement of the component pickup unit 18 and the counter-mass 19.

In FIG. 3 the component placement unit 18 and counter-mass 19 are located close to each other, whereby the component placement unit 18 is in its most left position and counter-mass 19 is in its most right position. In FIG. 4 the component placement unit 18 and counter-mass 19 are spaced apart, whereby the component placement unit 18 is in its most right position and counter-mass 19 is in its most left position.

It is important to understand that the reaction force of the linear motors of drives 23, 26 is not equal to the motor force. Due to internal losses (e.g., friction, damping), the reaction force on the subframe 14 is equal to the acceleration force. So the netto force $F_{nett}$ on the subframe 14 is the difference of both acceleration forces, as illustrated in the equations below.

$$F_{nett} = F_{Y,acc} - F_{B,acc}$$

$$F_{nett} = (F_{Y,mot} - F_{Y,fric}) - (F_{B,mot} - F_{B,fric})$$

In the equations above: $F_{Y,acc}$ is the force due to acceleration of the component placement unit 18; $F_{B,acc}$ is the force due to acceleration of the counter-mass 19; $F_{Y,mot}$ is the motor force of the first drive 23 of the component placement unit 18; $F_{Y,fric}$ is the friction force which occurs during movement of the component placement unit 18; $F_{B,mot}$ is the motor force of the second drive 26 of the counter-mass 19; and $F_{B,fric}$ is the friction force which occurs during movement of the counter-mass 19.

If the Y-motor force is simply feed forwarded ($F_{B,mot}=F_{Y,mot}$), the resulting force on the robot frame is equal to the difference of the internal friction losses ($F_{nett}=F_{B,fric}-F_{Y,fric}$). The friction forces differ by nature (e.g., two different mechanisms/drive trains).

Therefore, only the movements (and not the motor forces) should be synchronized, thus having the effect that the acceleration forces are equal and the netto force on the subframe 14 is zero.

The accuracy of the compensation depends on the ratio of the resulting netto force on the machine frame 12 and the stiffness of the subframe 14 / machine frame 12. For example, with a frame stiffness of $5.10^7$ [N/m] and a cross talk of less than 1 micrometer, the netto force error should be smaller than $5.10^7 * 10^{-6} = 50$ N.

In case the acceleration forces of the component placement unit 18 and the balance mass 19 are equal, the center of mass of both machine parts 18, 19 resides at exactly the same position. Because the center of mass is not moving, there is no reaction force. Even for very low stiffness frames, this concept will work.

Thus, for the center of mass of both machine parts 18, 19 being at a stable position, the equation below illustrates the relationship.

$$m_y \cdot y_{pos} = m_b \cdot b_{pos}$$

In the equation above: $m_y$ is the mass of the component placement unit 18; $y_{pos}$ is the position of the component placement unit 18; $m_b$ is the mass of the counter-mass 19; and $b_{pos}$ is the position of the counter-mass 19.

To limit the stroke of the counter-mass 19, the mass of the counter-mass 19 is larger than the mass of the component placement unit 18. The maximum stroke of the counter-mass 19 will be defined by the mass ratio of both masses, as shown by the equation below.

$$b_{stroke} = \frac{m_y}{m_b} \cdot y_{stroke}$$

In the equation above: $b_{stroke}$ is the stroke of the counter-mass 19; and $y_{stroke}$ is the stroke of the component placement unit 18.

As an example: $m_y$: ~10 kg; $y_{stroke}$: 750 mm; the maximum acceleration of the component placement unit 18: 25 m/s²; $m_b$: ~50 kg; $b_{stroke}$: 150 mm; and the maximum acceleration of the counter-mass 19: 5 m/s².

It is furthermore important that the two motor forces are in line, and that the center of mass of the counter-mass 19 and the center of mass of the component placement unit 18 are in line. In this situation there will be no disturbing force (equal motor forces) and no disturbing torque on the machine frame 12 that can cause additional deformations.

Another important effect is that there are no reaction forces to the factory floor. Especially when production equipment that is highly sensitive to floor vibrations is placed in the area of the component placement device 11, the component placement device 11 equipped with this balance mass technology desirably will not disturb this sensitive equipment.

By the component placement device 11 the nozzle is also movable in the component placement unit 18 in and opposite to X-direction, extending perpendicular to the plane of the drawing, in and opposite to Z-direction and rotatable about the Z-axis in PHI-direction.

Common machine controllers are capable of controlling four axes, for example, the movement in the Y-direction of the component placement unit 18 and the movements in X-, Z- and PHI-direction of the nozzle. To be able to also control the movement in the Y-direction of the counter-mass 19, the component placement device 1 is provided with a control unit 31/31' (See FIGS. 5A-5B).

Figure 5A:
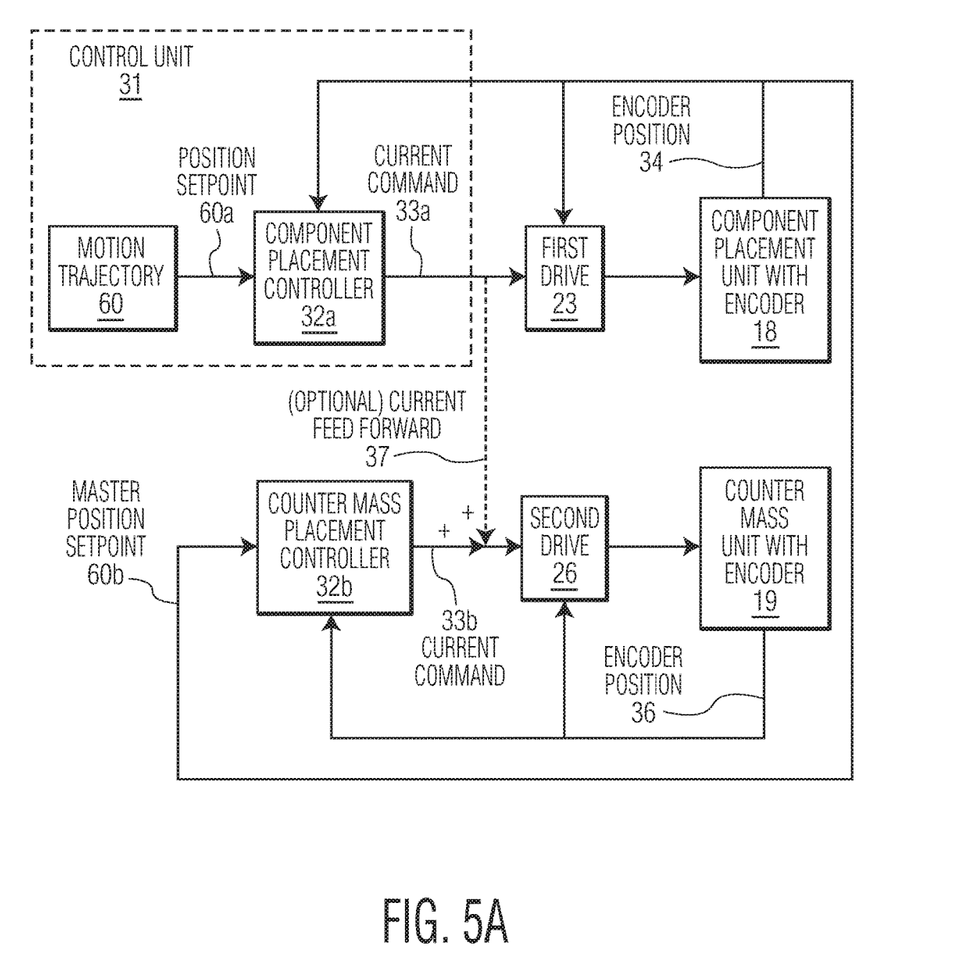
FIGS. 5A-5B are schematic views of exemplary inventive control units of the component placement device according to the invention as shown in FIG. 2.

Referring specifically to FIG. 5A, the control unit 31 includes a component placement controller 32a capable of controlling four axes, so the movement in Y-direction of the component placement unit 18 and the movements in X-, Z- and PHI-direction of the nozzle. In FIG. 5A, only the control of the movement in one direction (e.g., the Y-direction) is shown. A position setpoint 60a is provided from the motion trajectory 60 (e.g., the motion trajectory along the Y-axis) to the component placement controller 32a. From the component placement controller 32a, a current command 33a is sent to the first drive 23 which results in movement of the component placement unit (with encoder) 18 to a certain position. During the movement, the position (e.g., the Y-position) of the component placement unit 18 is determined by means of an encoder (included in unit 18). The encoder position 34 (e.g., the Y-axis encoder position) is sent back to the component placement controller 32a and the first drive 23, to correct possible differences between the actual position and the desired position. This a typical master control function.

Further, and as shown in FIG. 5A, the encoder position 34 of the component placement unit 18 is sent to the counter mass placement controller 32b (in a master slave configuration, where the position of the counter mass slave axis responds to the actual position of the component placement unit master axis). The encoder position 36 (e.g., the Y-axis encoder position of the counter mass) is provided from the counter mass unit 19 to the second drive 26 and to counter mass placement controller 32b. The encoder position 34 of the component placement unit 18 serves as master setpoint 60b that is provided to counter mass placement controller 32b. The second drive 26 is being activated which results in movement of the counter mass unit 19 to a certain position. During the movement, the encoder position (e.g., the Y-position) of the counter mass unit 19 is determined by the encoder (included in counter mass unit 19). The encoder position 36 of the counter mass unit 19 is sent back to the second drive 26, to correct possible differences between the actual position and the desired position. The control of the counter mass unit 19 follows as a slave by the control of the component placement unit 18.

In order to improve the synchronization accuracy of the master and slave, one could use the current command 33a (i.e., a control signal) of the component placement controller 32a to provide current feed forward signal 37 to the second drive 26 (slave drive).

Figure 5B:
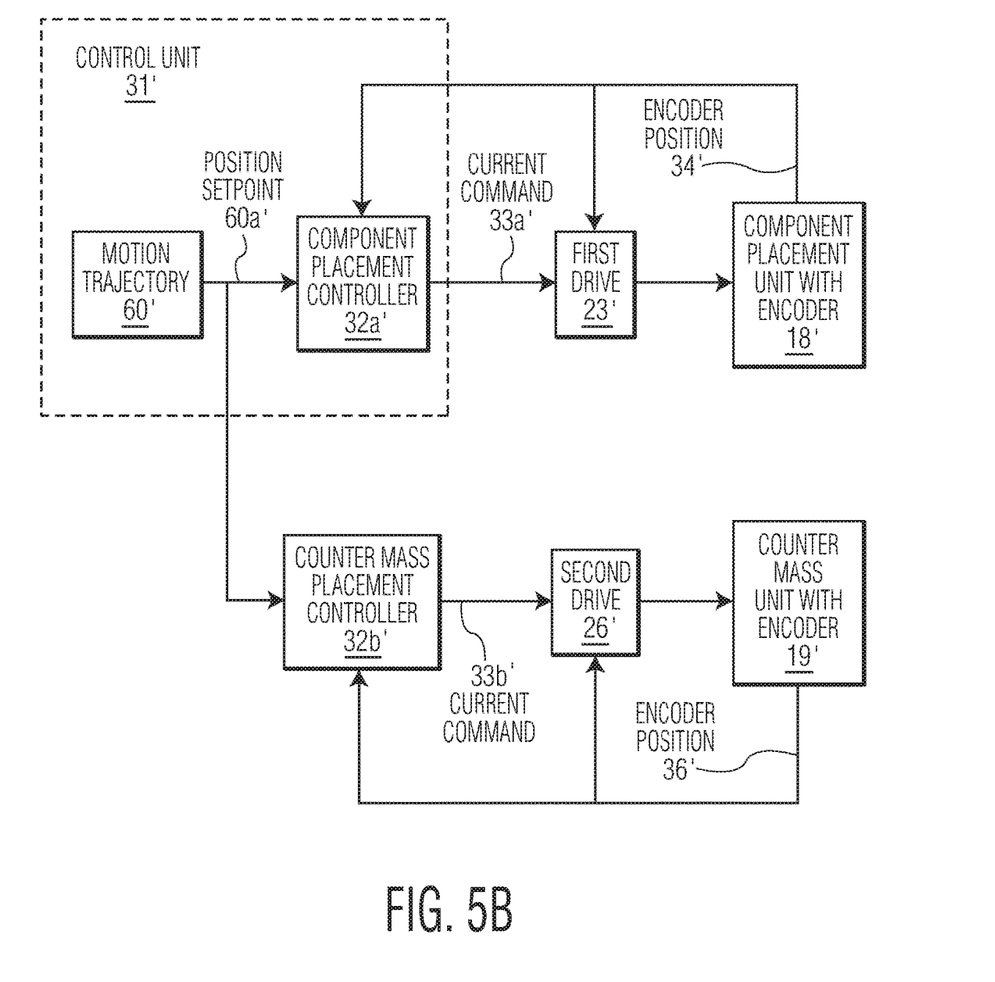

As opposed to the master/slave configuration shown in FIG. 5A, FIG. 5B illustrates an alternative configuration referred to herein as a "synchronized" motion including control unit 31', where both motion systems (e.g., the component placement controller 32a' and the counter mass placement controller 32b') get the same (scaled) position command (e.g., a position setpoint 60a' from motion trajectory 60') so that the motion systems move synchronously. From the component placement controller 32a', a current command 33a' is sent to the first drive 23' which results in movement of the component placement unit (with encoder) 18' to a certain position. During the movement, the position (e.g., the Y-position) of the component placement unit 18' is determined by means of an encoder (included in unit 18'). The encoder position 34' (e.g., the Y-axis encoder position) is sent back to the component placement controller 32a' and the first drive 23', to correct possible differences between the actual position and the desired position. From the counter mass placement controller 32b', a current command 33b' is sent to the second drive 26' which results in movement of the counter mass unit (with encoder) 19' to a certain position. During the movement, the position (e.g., the Y-position) of the counter mass unit 19' is determined by means of an encoder (included in unit 19'). The encoder position 36' (e.g., the Y-axis encoder position) is sent back to the counter mass placement controller 32b' and the second drive 26', to correct possible differences between the actual position and the desired position.

Before the control unit 31 in FIG. 5A can be activated (or control unit 31' in FIG. 5B), the component placement unit 18 (or 18') and the counter mass unit 19 (or 19') are desirably moved to their initial positions, for example, the positions as shown in FIG. 3 or in FIG. 4, so that the positions are synchronized.

An exemplary case study is now provided. Specifically, an example of a component placement device 1 is now given. Exemplary parameters include: machine frame 12 mass: 1000 kg; machine frame 12 eigen frequency: 35 Hz; subframe 14 mass: 80 kg; subframe 14 eigen frequency: 100 Hz; controller settings (as in machine, bandwidth ~70 Hz); component placement unit 18 mass: 15 kg; ratio countermass 19 mass—component placement unit 18 mass: 5 [-]; counter-mass unit 19 mass: 75 kg; counter-mass 19 open loop controller bandwidth: 70 Hz; balance mass controller: master—slave, no current feed forward 37; stroke of component placement unit 18: 300 mm; velocity of component placement unit 18: 1.5 m/s; and acceleration of component placement unit 18: 25 m/s$^2$; jerk of component placement unit 18: 2000 m/s$^3$.

Figure 6:
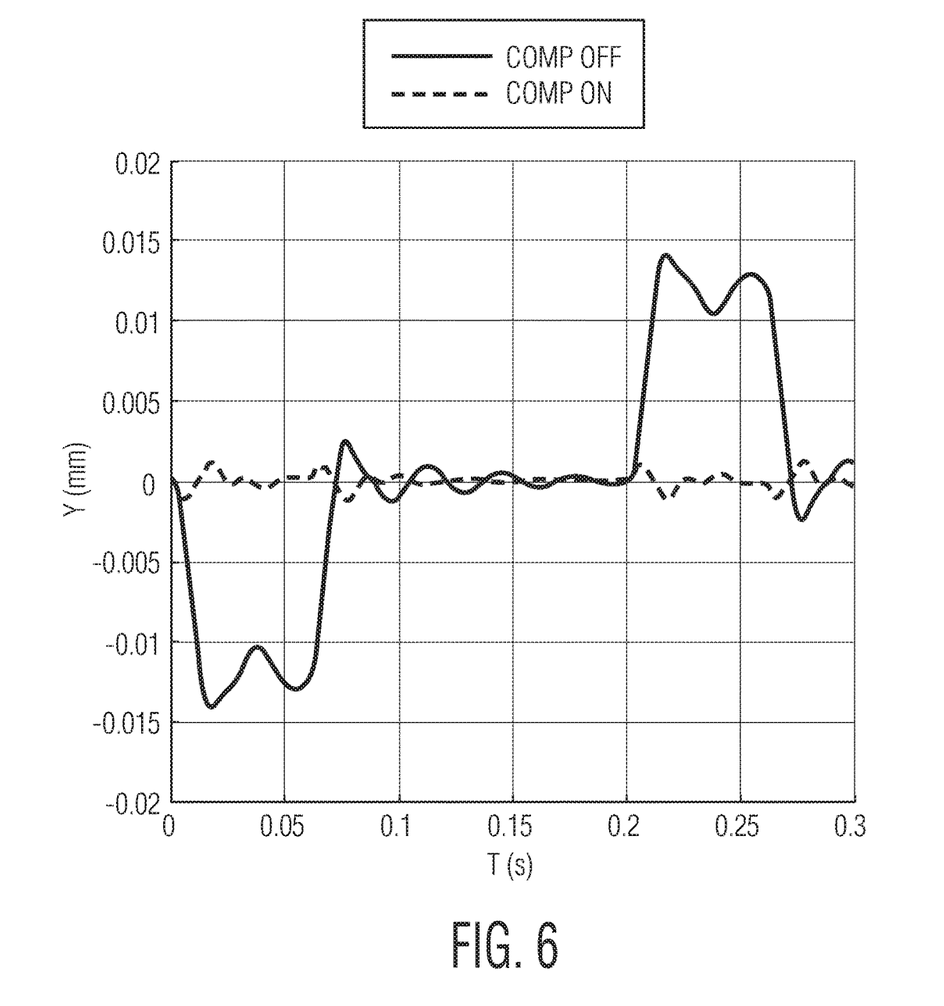
FIG. 6 is a diagram showing the movement of the component placement device of a component placement device according to the prior art and of the component placement device according to the invention as shown in FIGS. 2-4 and 5A-5B.
Figure 7:
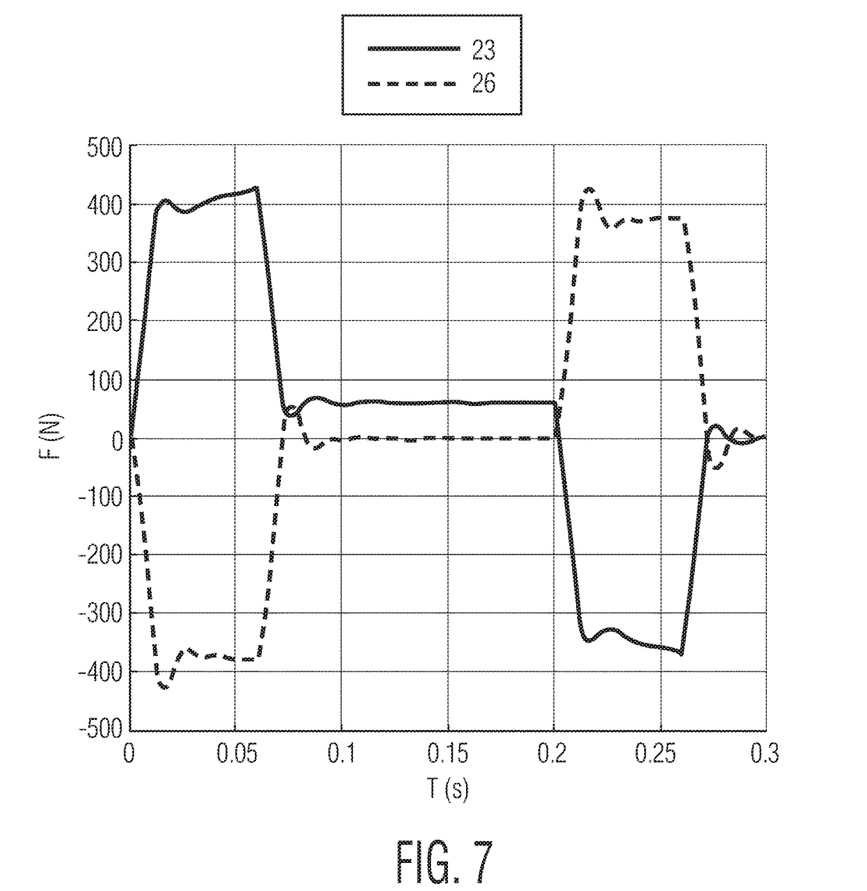
FIG. 7 is a diagram showing the motor forces of the component placement device according to the invention as shown in FIGS. 2-4 and 5A-5B.

In FIGS. 6 and 7 the results of the study based on the above given values are shown. As can be seen in FIG. 6, without the counter mass unit 19 the subframe 14 would be moved over 14 micrometers in both directions with respect to the machine frame 12 ("COMP OFF"). With the counter mass unit 19 the subframe 14 would be moved over less than 1 micrometer in both directions with respect to the machine frame 12 ("COMP ON"). The deformation is similar to the acceleration profile.

Thus, the frame displacement is reduced from 14 micrometers to 1 micrometer. Further, improvement is possible with current feed forward 37, but because the robot displacement is already that small, current feed forward is not needed (the bandwidth of the counter mass-axis control loop is high enough (70 Hz)) in this study.

In FIG. 7 the motor forces F of the first and second drive 23, 26 are shown. As can be seen the motor force of the first drive 23 contains a speed dependent part (damping). A part of the motor force is needed to overcome the internal drive friction/damping. The small overshoot in the motor force of the second drive 26 occurs due to the missing feed forward 37, thus resulting in a small ripple in the robot cross talk during the jerk phase.

It is also possible to use a control unit whereby the machine controller 32 is capable of directly controlling all movements.

Examples of the component placement device of the invention include SMT (surface-mount technology) pick and place machines; other pick and place machines; semiconductor die attach machines; thermocompression bonding machines; flip chip bonding machines; etc.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A component placement device comprising:
   a machine frame;
   a subframe supported by the machine frame;
   a component pickup unit that is movable relative to the subframe, the component pickup unit being movable by a first drive at least in a direction of movement; and
   a movable counter-mass being movable relative to the subframe by a second drive in a direction opposite to the direction of movement of the component pickup unit to at least partially counteract a reactive force exerted on the subframe by the component pickup unit during movement of the component pickup unit in the direction of movement relative to the subframe, wherein a mass of the moveable counter-mass is different from a mass of the component pickup unit, wherein the component placement device includes a control unit for delivering a control signal for controlling the movement of the component pickup unit in the direction of movement, wherein the control unit is provided with an actual position of the component pickup unit as a setpoint for calculating a desired position of the counter-mass.

2. A component placement device according to claim 1, wherein forces exerted by the second drive for driving the counter-mass are in line with the forces exerted by the first drive for driving the component pickup unit during movement of the counter-mass and the component pickup unit.

3. A component placement device according to claim 2, wherein a virtual line through a center of mass of the component pickup unit and a center of mass of the counter-mass extends parallel to the direction of movement during movement of the component pickup unit and the counter-mass.

4. A component placement device according to claim 1, wherein a current command provided by the control unit to the first drive of the component placement unit is also provided to the second drive of the counter-mass.

5. A component placement device according to claim 1, wherein the first and second drives for the component placement unit and the counter-mass include linear motors, each linear motor being provided with a linear stator supported by the subframe and permanent magnets being located on the component placement unit and the counter-mass, respectively.

6. A component placement device according to claim 1, wherein the component placement device includes at least two component pickup units which are each independently movable at least in a direction of movement relative to a corresponding subframe supported by the machine frame, whereby each component pickup unit cooperates with a respective counter-mass being movable in a direction opposite to the direction of movement of the corresponding component pickup unit.

7. The component placement device of claim 1 wherein the component placement device is a surface-mount technology pick and place machine.

8. The component placement device of claim 1 wherein the component placement device is a pick and place machine.

9. The component placement device of claim 1 wherein the component placement device is a semiconductor die attach machine.

10. The component placement device of claim 1 wherein the component placement device is a thermocompression bonding machine.

11. The component placement device of claim 1 wherein the component placement device is a flip chip bonding machine.

12. A method for driving a component placement device comprising at least a machine frame and a component pickup unit which is movable relative to a subframe supported by the machine frame, the component pickup unit being movable at least in a direction of movement by a first drive, wherein the component placement device includes a movable counter-mass being movable relative to the subframe by a second drive in a direction opposite to the direction of movement of the component pickup unit to at least partially counteract a reactive force exerted on the subframe by the component pickup unit whilst moving the component pickup unit in the direction of movement relative to the subframe, wherein a mass of the movable counter-mass is different from a mass of the component pickup unit, wherein the component placement device includes a control unit for delivering a control signal for controlling the movement of the component pickup unit in the direction of movement, wherein the control unit is provided with an actual position of the component pickup unit as a setpoint for calculating a desired position of the counter-mass.

13. The method according to claim 12, wherein a current command provided by the control unit to the first drive is also provided to the second drive.

* * * * *